US007870531B2

(12) United States Patent
Bhattacharya et al.

(10) Patent No.: US 7,870,531 B2
(45) Date of Patent: *Jan. 11, 2011

(54) SYSTEM FOR USING PARTITIONED MASKS TO BUILD A CHIP

(75) Inventors: Subhrajit Bhattacharya, White Plains, NY (US); John Darringer, Mahopac, NY (US); Daniel L. Ostapko, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 327 days.

This patent is subject to a terminal disclaimer.

(21) Appl. No.: 12/117,841

(22) Filed: May 9, 2008

(65) Prior Publication Data

US 2008/0216037 A1      Sep. 4, 2008

Related U.S. Application Data

(63) Continuation of application No. 11/359,229, filed on Feb. 22, 2006, now Pat. No. 7,469,401.

(51) Int. Cl.
*G06F 17/50* (2006.01)

(52) U.S. Cl. .................... 716/19; 716/7; 716/21
(58) Field of Classification Search .............. 716/7, 716/19, 21
See application file for complete search history.

(56) References Cited

U.S. PATENT DOCUMENTS

| 5,877,632 | A  | 3/1999  | Goetting et al. |
| 6,269,467 | B1 | 7/2001  | Chang et al. |
| 6,383,847 | B1 | 5/2002  | Ditlow et al. |
| 6,678,645 | B1 | 1/2004  | Rajsuman et al. |
| 6,976,197 | B2 | 12/2005 | Faust et al. |
| 7,176,716 | B2 | 2/2007  | Madurawe |

*Primary Examiner*—Sun J Lin
(74) *Attorney, Agent, or Firm*—Brian Verminski; Hoffman Warnick LLC

(57) ABSTRACT

A mask reuse methodology process in which the soft logic is implemented with a generic array type cell structure mask and a custom blocking mask. A system is provided comprising a mask set having a plurality of reusable masks corresponding to a plurality of hard intellectual property (IP) components; a generic array type cell mask; and a custom blocking mask that includes blocking regions that positionally correspond with a set of IP components printed on a die.

9 Claims, 6 Drawing Sheets

SYSTEM FOR USING PARTITIONED MASKS TO BUILD A CHIP

The current application is a continuation application of U.S. patent application Ser. No. 11/359,229, filed on Feb. 22, 2006, now U.S. Pat. No. 7,469,401, which is hereby incorporated by reference.

FIELD OF THE INVENTION

The present invention relates generally to design and manufacturing of chips, and more particularly to the design and manufacturing of chips with reusable content.

BACKGROUND OF THE INVENTION

As silicon capabilities continue to increase, the ability to efficiently design and manufacture chips becomes increasingly critical to their deployment. The times required to build chips have begun to exceed the required time to market. The increasingly complex efforts relating to physical design of the chips have accorded a great sense of urgency on addressing "second order" effects to meet time-related goals. For instance, the resolution of minimum device features comparable to (or smaller than) the wavelength of the exposing light has made the lithography for mask making increasingly complex and expensive. All of these second order effects increase the cost of designing a chip to the point where only high volume chips are economically viable.

The industry has responded to this situation by initiating the development of System-On-a-Chip (SoC) methodologies. This approach integrates pre-designed or pre-verified components, called intellectual property (IP) components or cores, into single chip designs. For instance, an SoC may include IP components such as a central processing unit (CPU), a universal asynchronous receiver/transmitter (UART), an enhanced multiply/accumulate unit (EMAC), etc. Typically, an SoC design specification is hierarchical and the hierarchy clearly separates the IP components used in the SoC. However, many designs are processed by the design tools as a flat netlist, ignoring the SoC hierarchy. The design hierarchy is definitely flattened at the manufacturing phase. Accordingly, the reusability of an IP block is ignored during the manufacturing phase. Thus, even though the SoC approach partially addresses the design cost and complexity by means of re-use at the resistor-transistor logic (RTL) level, it fails to address the dramatically increasing costs related to mask data preparation and mask building.

U.S. Pat. No. 6,383,847 B1, entitled "Partitioned Mask Layout," issued on May 7, 2002, to Ditlow et al., which is hereby incorporated by reference, teaches a mask reuse methodology (MRM) that utilizes reusable partitioned masks that provide "hard" logic to reduce the cost of making a mask set for an SoC device. In particular, the '847 patent teaches the idea of having a reusable mask set for a library of different IP components. Thus, when a chip requires one or more of these components, existing masks that correspond to the required components are used to create the component(s). Each component on the chip is thus fabricated as a partition in a separate fabrication step.

However, the '847 patent does not describe how to create a mask set for the soft logic for the chip. Soft logic refers to any logic that is not provided by a reusable mask set, including, e.g., glue logic that connects IP blocks, custom logic required for a customer's particular application, etc.

Accordingly, a need exists for an efficient process for creating a mask for the soft logic, and for utilizing the mask set of the IP blocks and the mask set for the soft logic to build a complete chip.

SUMMARY OF THE INVENTION

The present invention addresses the above-mentioned problems, as well as others, by providing a mask reuse methodology (MRM) process in which the soft logic is implemented with a generic array type cell structure mask and a custom blocking mask.

In a first aspect, the invention provides a method of implementing a mask reuse methodology process, comprising: printing a set of component cores onto a die at predetermined locations with a reusable mask set; providing a custom blocking mask that includes blocking regions that positionally correspond with the component cores on the die; superimposing the custom blocking mask with a generic array type cell mask to form superimposed masks; and using the superimposed masks to print generic array type cells onto the die with the exception of the predetermined locations where the set of component cores reside.

In a second aspect, the invention provides a system for performing a mask reuse method process, comprising: a mask set have a plurality of reusable masks corresponding to a plurality of hard intellectual property (IP) components; a generic array type cell mask; and a custom blocking mask that includes blocking regions that positionally correspond with a set of IP component printed on a die.

In a third aspect, the invention provides a method of implementing a mask reuse methodology process, comprising: printing a set of component cores onto a die at predetermined locations with a reusable mask set; providing a custom logic mask that includes soft logic for the set of component cores printed onto the die, wherein the custom logic mask includes blocked regions that positionally correspond to the set of component cores; and printing the soft logic onto the die using the custom logic mask.

BRIEF DESCRIPTION OF THE DRAWINGS

These and other features of this invention will be more readily understood from the following detailed description of the various aspects of the invention taken in conjunction with the accompanying drawings in which.

DETAILED DESCRIPTION OF THE INVENTION

As noted above, in a mask reuse methodology (MRM), intellectual property (IP) blocks or "component cores," comprising "hard" logic defined by a reusable mask set, are used to fabricate SoC devices. However, while the IP blocks provide a significant portion of the functionality that goes into a SoC device, additional "soft" logic is also required to complete the device logic. Soft logic generally comprises that portion of the chip that is not implemented with reusable masks. Examples of soft logic include, e.g., glue logic used to stitch IP blocks, any necessary customer logic, small IP blocks, etc.

The present invention implements the soft logic using: (1) a "generic" array type cell structure mask, and (2) a custom "blocking" mask. Once laid down, the gate-array cells (or equivalent structure) are customized using metal layers in a further processing step. Note that the illustrative embodiments described herein implement an array type cell structure using gate array cells. However, the invention is not limited to using gate array cells, and other equivalent array type cell structures, such as field programmable gate arrays (FPGA's), or structured application specific integrated circuits (ASIC's) could be used.

Figure 1:
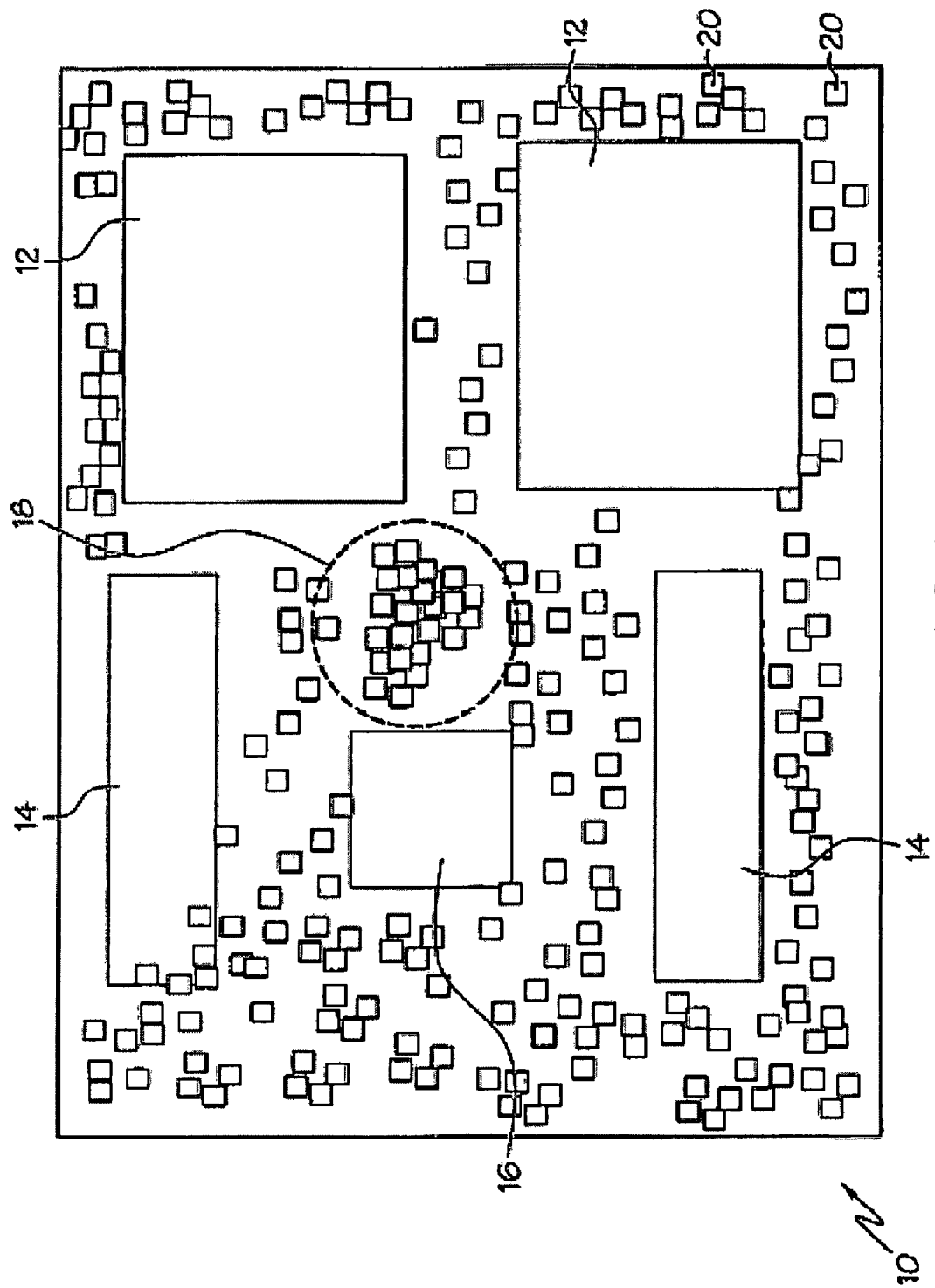
FIG. 1 depicts a simplified example of a layout of an SoC device in accordance with the present invention.

FIG. 1 depicts a simplified example of a complete component layout of an SoC device 10 printed on a die that includes five hard logic IP blocks 12, 14, and 16, a plurality of soft glue logic blocks 20 and a set of soft small IP blocks 18. A first set of IP logic blocks 14 and a second set of IP logic blocks 12 are each instantiated twice. That is, both IP blocks 12 are identical, and both IP blocks 14 are identical.

Figure 2:
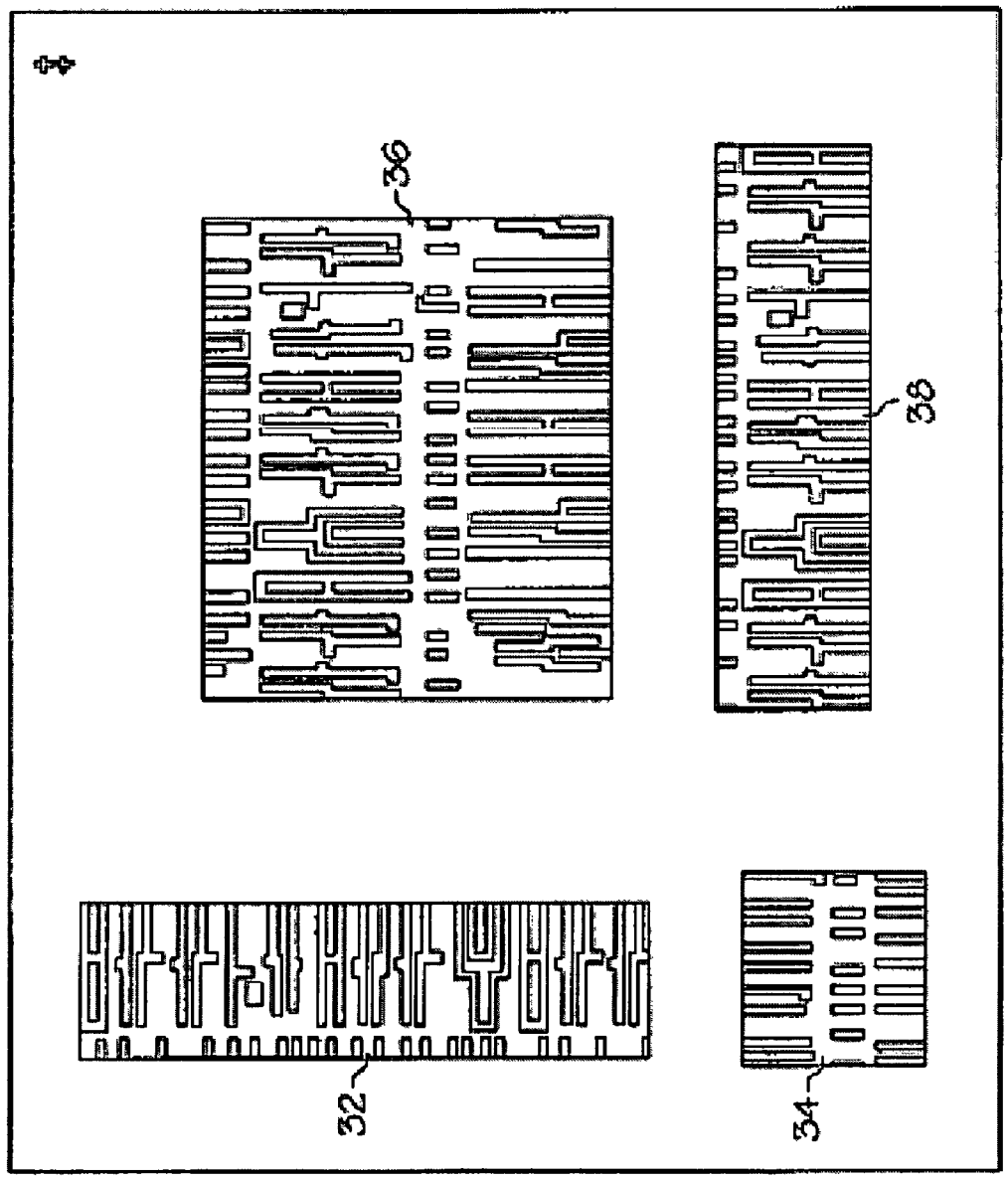
FIG. 2 depicts a reticle having a mask set for printing the hard IP blocks of FIG. 1 in accordance with the present invention.

The five hard logic IP blocks 12, 14, and 16 can be printed using a reticle 30, such as that shown in FIG. 2, containing a set reusable masks 32, 34, 36, and 38. In this example, IP blocks 14 (FIG. 1) are implemented with mask 38 (FIG. 2), IP block 16 is implemented with mask 34, and IP blocks 12 are implemented with mask 36. Note that this requires a multi-step (partitioned) exposure process, with each partition step requiring the selection and unique placement of a mask from reticle 30 over the SoC device 10 to print a unique IP block. Note that while this example includes all necessary IP block masks on a single reticle, the mask set could reside on multiple reticles. Also note that the MRM process is described herein for a single mask layer. In practice, the process may have to be repeated for each mask layer except for the metal and via layers. Metal and via layers will still be manufactured in the traditional way requiring custom (and not MRM) masks.

Figure 3:
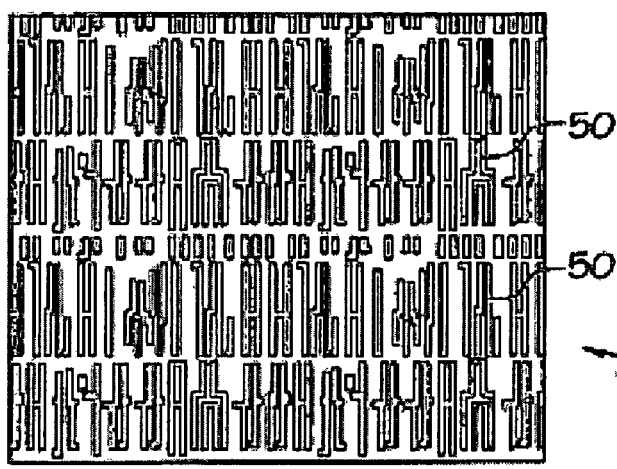
FIG. 3 depicts a generic gate array cell mask in accordance with the present invention.
Figure 4:
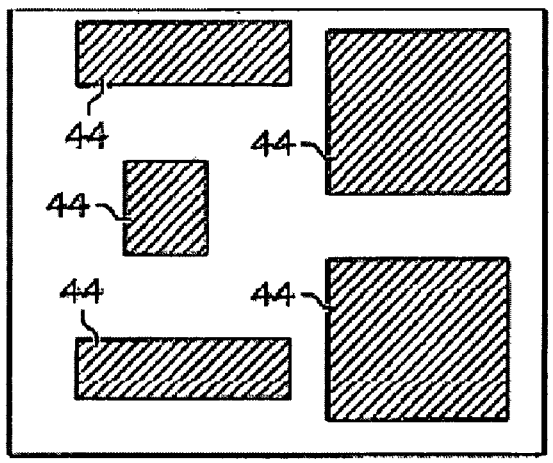
FIG. 4 depicts a custom blocking mask configured for the layout of FIG. 1 in accordance with the present invention.
Figure 5:
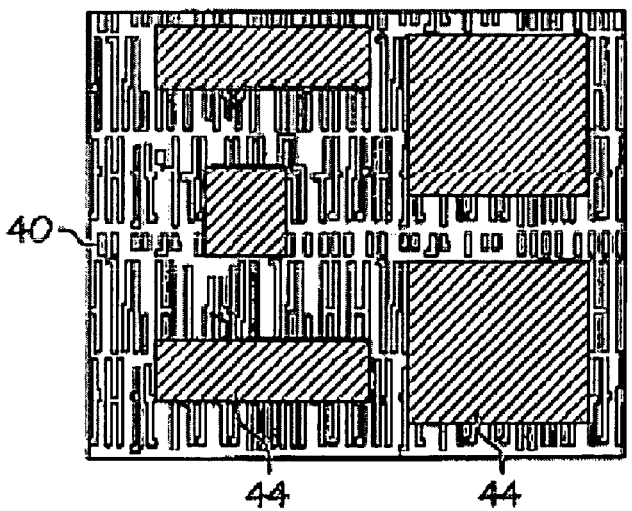
FIG. 5 depicts superimposed masks of FIGS. 3 and 4 in accordance with the present invention.

Once the hard IP blocks 12, 14 and 16 are printed, the soft logic needs to be added. In this illustrative embodiment, the soft logic is implemented with a generic gate array mask 40, as shown in FIG. 3, and a custom blocking mask 42, as shown in FIG. 4. In this simplified example, the generic gate array mask 40 comprises a gate array layout 50 configured to print gate array cells over the entire SoC device 10. Accordingly, the generic gate array mask 40 could not be used by itself, since the gate array layout 50 would be printed over the locations of the hard cores already printed 10. Instead, an accompanying custom blocking mask 42 is utilized with the generic gate array mask 40, shown in FIG. 5, as a pair of superimposed masks 46. The custom blocking mask 42 is essentially transparent except for a set of blocking regions 44 (which in this case are opaque) that positionally correspond to the hard IP blocks 12, 14 and 16 already printed on the device 10. It should be noted that the blocking mask as described may also be implemented inversely, where the mask is essentially opaque except for a set of blocking regions 44 (which in this case are transparent) that positionally correspond to the hard IP blocks 12, 14 and 16 already printed on the device 10. Whether the blocking regions 44 in the blocking mask 42 are essentially transparent or opaque will depend upon the type of mask (i.e., negative or positive) required for the particular exposure step.

Figure 6:
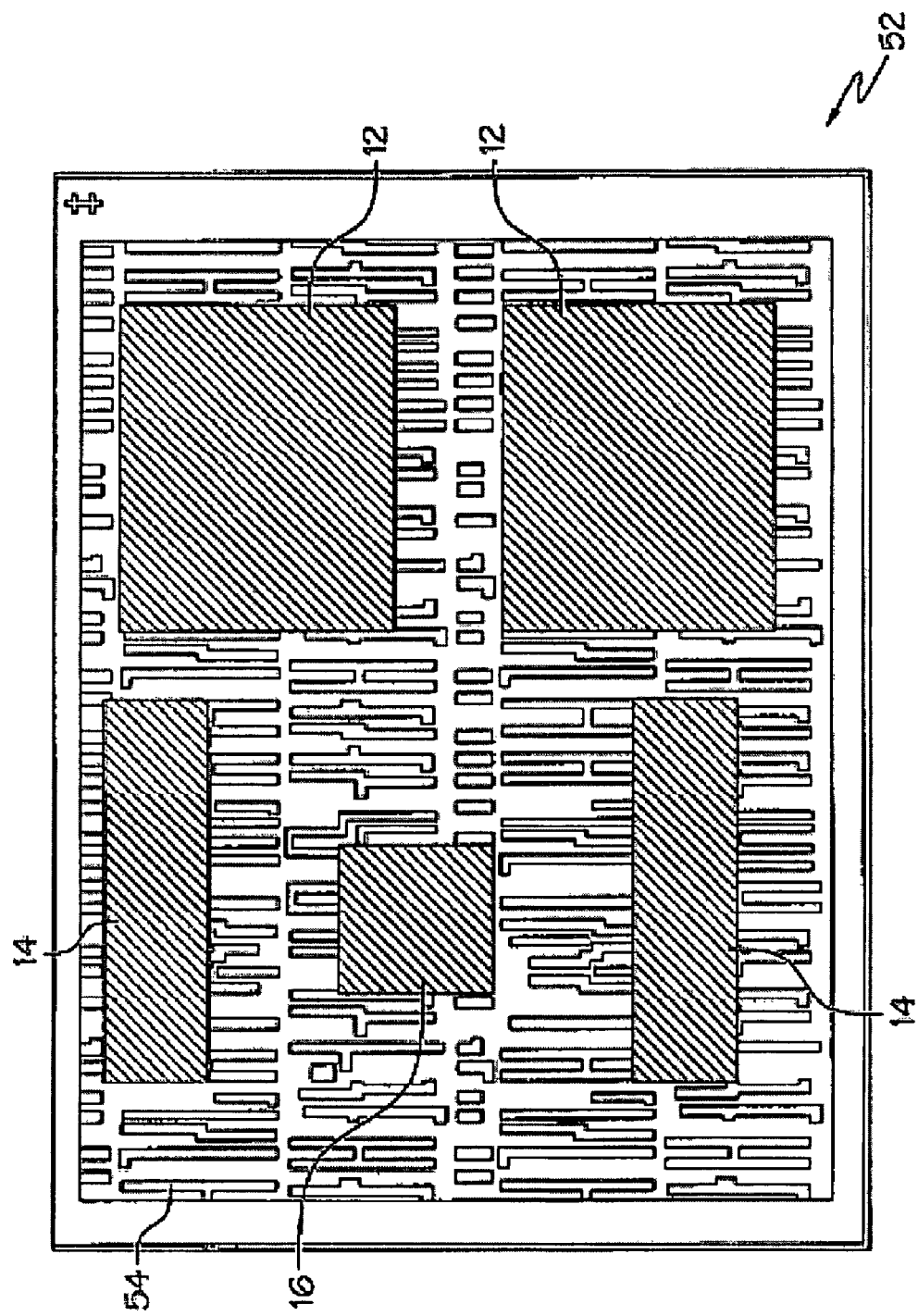
FIG. 6 depicts the result of printing the superimposed masks of FIG. 5 in accordance with the present invention.

Regardless of which type is used, the superimposed masks 46 blank out the portions of the device 10 which contain the hard IP blocks 12, 14 and 16. To print out the gate array cells in the regions outside the hard cores, the superimposed masks 46 are exposed to a scanner. The resulting structure 52 is shown in FIG. 6, which includes: (1) the hard IP blocks 12, 14 and 16; and (2) gate array cells 54 printed everywhere else, i.e., outside the hard IP blocks 12, 14 and 16.

Note that the custom blocking mask 42 is relatively easy to construct since it has a few large rectilinear shapes, i.e., blocking regions 44. It should also be noted that the custom blocking mask 42 could be used with other gate array masks needed for the device, e.g., for all the layers such as implant blocking and isolation layers.

Figure 7:
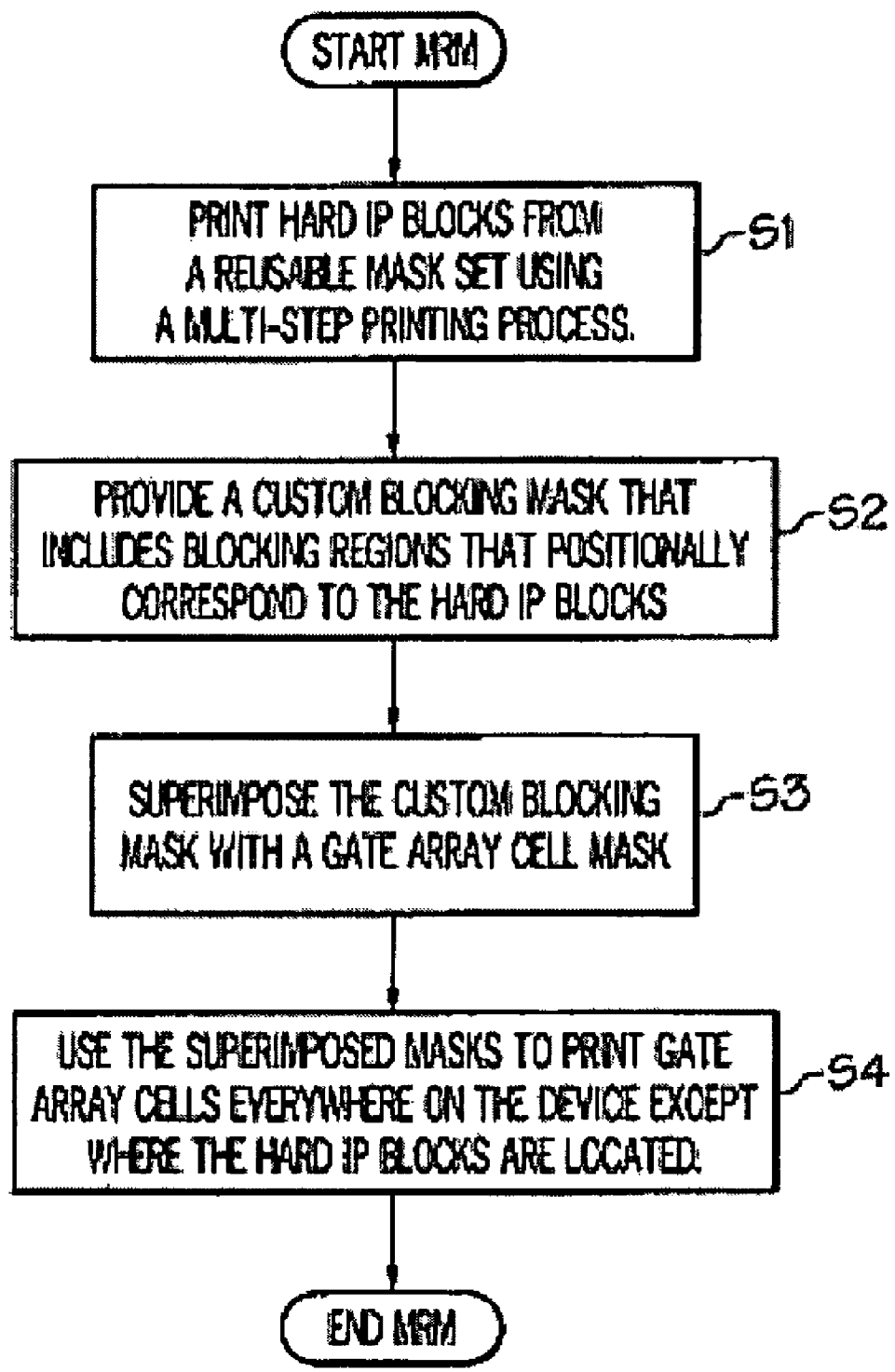
FIG. 7 depicts a flow chart for implementing a mask reuse methodology (MRM) process in accordance with the present invention.

Referring now to FIG. 7, a flow diagram of a mask reuse methodology (MRM) process is shown. At step S1, hard IP blocks 12, 14 and 16 are printed onto a die from a reusable mask set 30 using a multi-step partition process. Next, at step S2, a custom blocking mask 42 is provided having blocking regions 44 that positionally correspond to the hard IP blocks 12, 14 and 16 printed on the die. At step S3, the custom blocking mask 42 is superimposed with a gate array cell mask 40 (or equivalent array type cell structure mask). At step S4, the superimposed masks 46 are used to print gate array cells everywhere on the device except where the hard IP blocks are located. The resulting structure can be further processed using techniques readily understood in the art.

Figure 8:
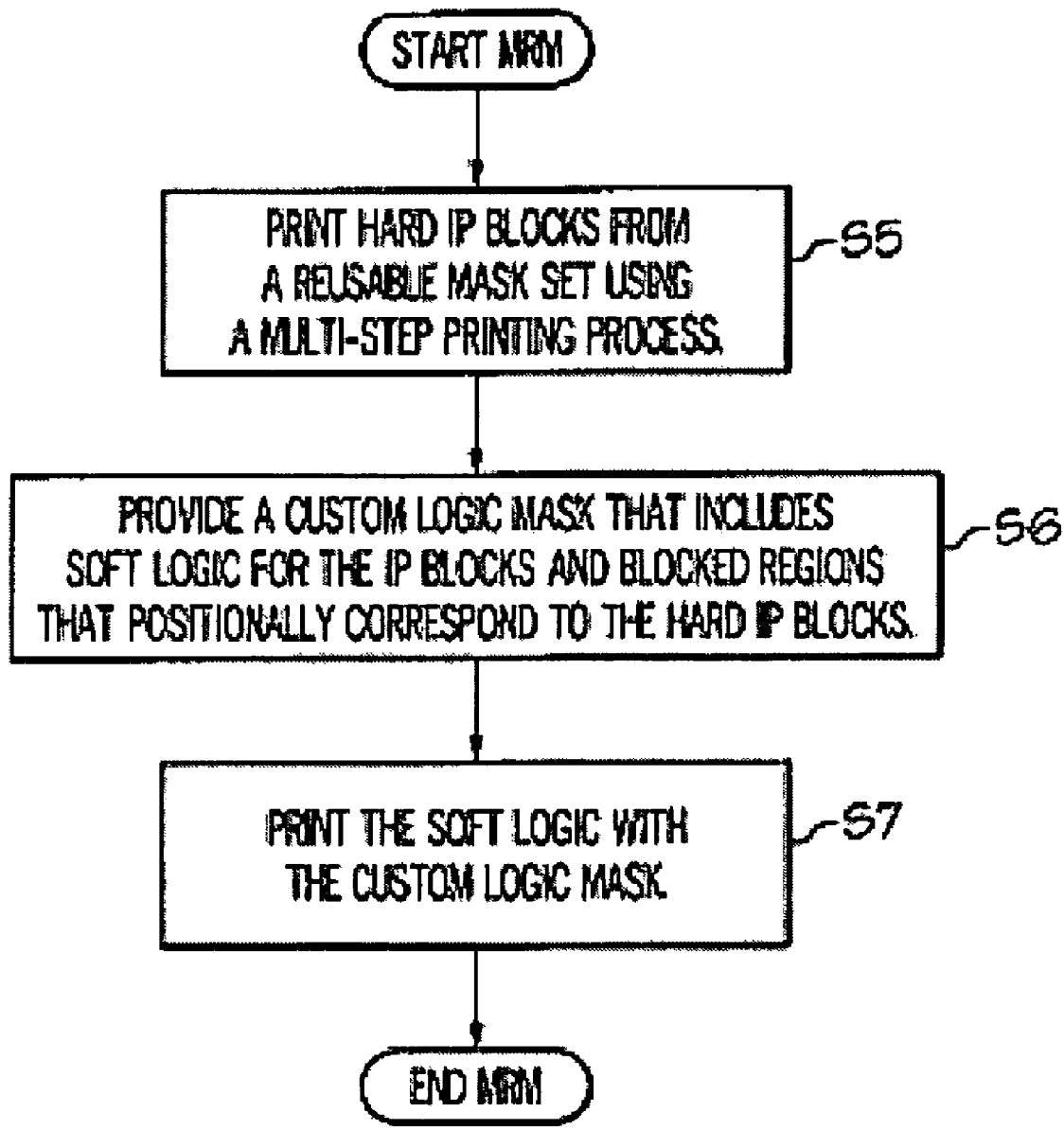
FIG. 8 depicts a flow chart for implementing an alternative mask reuse methodology (MRM) process in accordance with the present invention.

In an alternative embodiment, standard logic cells may be used to provide the soft logic rather than gate array type cells. One method for implementing standard logic cells would be to provide a custom logic mask that includes soft logic for the component cores printed using a reusable mask set such as that described above. In this embodiment, the custom logic mask would include "blocked regions" that positionally correspond to the printed component cores. Using the custom logic mask, the soft logic is printed only in areas around the component cores. Note that any type of cells may be used to provide the soft logic. FIG. 8 depicts a flow chart showing such a process. In step S5, hard IP blocks are printed from a reusable mask set using a multi-step printing process. Next at step S6, a custom logic mask is provided that includes soft logic for the IP blocks and further includes blocked regions that positionally correspond to the hard IP blocks. Finally, at step S7, the soft logic is printed with the custom logic mask.

Using standard logic cells instead of gate array cells for the soft logic leads to a more efficient implementation for the soft logic. However, a standard cell mask set constructed for the soft logic would only be reusable for the chip for which the mask set was built. This lack of generality of standard cell implementations for the soft logic reduces the cost benefit of MRM. Note however that there may be some scenarios where a mask set for soft logic implemented using standard logic cells may be appropriate. Note that in such an implementation, and other similar cases, the custom blocking mask 42 used to blank out areas occupied by a hard core is not required since the blocked regions can be directly built into the custom logic mask for the soft logic. Even though this makes the mask set for the soft logic more complex, it reduces complexity of the manufacturing process.

There are several advantages of an MRM method for manufacturing a chip which go beyond manufacturing. MRM can reduce manufacturing cost and time. But MRM can also reduce design complexity and cost. Since the hard IP blocks have been pre-designed and their mask set can be pre-verified, the uncertainty associated with fabricating logic with unverified masks is to a large extent non-existent. Hence less design effort has to be spent to compensate for uncertainty or to test for uncertainty.

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

The invention claimed is:

1. A system for performing a mask reuse method process, comprising:
   a reusable mask set having a plurality of reusable masks corresponding to a plurality of hard intellectual property (IP) components;
   a generic array type cell mask; and
   a custom blocking mask that includes blocking regions that positionally correspond with a set of IP components printed on a die.

2. The system of claim 1, wherein the custom blocking mask is transparent except for where the blocking regions exist.

3. The system of claim 1, wherein the custom blocking mask is opaque except for where the blocking regions exist.

4. The system of claim 1, wherein the generic array type cell mask is configured for printing gate array cells.

5. The system of claim 1, wherein the generic array type cell mask is configured for printing fixed programmable gate arrays (FPGAs).

6. The system of claim 1, wherein the generic array type cell mask is configured for printing structured application specific integrated circuits (ASICs).

7. The system of claim 1, wherein the reusable mask set is provided on a single reticle.

8. The system of claim 1, wherein the generic array type cell mask is used to form circuits selected from a group consisting of: glue logic, customer applications, and small intellectual property blocks.

9. The system of claim 1, wherein the generic array type cell mask and the custom blocking mask can be superimposed to allow generic array type cells to be printed outside the set of IP components on the die.

* * * * *